(12) United States Patent
Faragher et al.

(10) Patent No.: US 9,780,829 B1
(45) Date of Patent: Oct. 3, 2017

(54) METHOD, APPARATUS, COMPUTER PROGRAM, CHIP SET, OR DATA STRUCTURE FOR CORRELATING A DIGITAL SIGNAL AND A CORRELATION CODE

(71) Applicant: Focal Point Positioning Ltd., Cambridge (GB)

(72) Inventors: Ramsey Faragher, Cambridge (GB); Nicolas Couronneau, Bristol (GB); Robert Mark Crockett, Hertfordshire (GB)

(73) Assignee: Focal Point Positioning Ltd., Cambridge (GB)

( * ) Notice: Subject to any disclaimer, the term of this patent is extended or adjusted under 35 U.S.C. 154(b) by 0 days.

(21) Appl. No.: 15/080,294

(22) Filed: Mar. 24, 2016

(51) Int. Cl.
| H04L 27/10 | (2006.01) |
| H04B 1/709 | (2011.01) |
| H04B 1/711 | (2011.01) |
| H03M 1/74 | (2006.01) |

(52) U.S. Cl.
CPC ............ *H04B 1/709* (2013.01); *H03M 1/74* (2013.01); *H04B 1/711* (2013.01)

(58) Field of Classification Search
CPC ............ G01S 13/9011; G01S 13/9017; G01S 2007/4065; G01S 2007/4069; G01S 2007/4078; G01S 7/4021; G01S 13/24
USPC .......................................... 375/275; 382/100
See application file for complete search history.

(56) References Cited

U.S. PATENT DOCUMENTS

| 4,580,224 A * | 4/1986 | Gerber ................... B21B 37/66 700/156 |
| 4,618,930 A * | 10/1986 | Ueno ....................... B61L 3/008 246/182 C |
| 5,079,553 A * | 1/1992 | Orr .......................... G01S 7/022 342/20 |
| 6,556,688 B1 * | 4/2003 | Ratnakar ................. G06T 1/005 382/100 |
| 6,917,654 B1 * | 7/2005 | Cerda, Jr. ............... H03M 1/74 341/173 |

(Continued)

FOREIGN PATENT DOCUMENTS

| GB | 2509343 | 7/2014 ............ G01S 19/24 |
| GB | 2509343 A | 7/2014 |

(Continued)

OTHER PUBLICATIONS

Broumandan, A. et al., "Direction of Arrival Estimation of GNSS Signals Based on Synthetic Antenna Array," 2007 Institute of Navigation (ION) Global Navigation Satellite System (GNSS) Conference, Sep. 25-27, 2007, Fort Worth, TX, pp. 1-11.
Kubrak, Damien et al., "Performance Analysis of MEMS Based Pedestrian Navigation Systems," ION GNSS 18th International Technical Meeting of the Satellite Division, Sep. 13-16, 2005, Long Beach, CA, pp. 2976-2986.

(Continued)

*Primary Examiner* — Daniel Washburn
*Assistant Examiner* — Sarah Hassan
(74) *Attorney, Agent, or Firm* — Sunstein Kann Murphy & Timbers LLP

(57) ABSTRACT

A method, apparatus, computer program, data structure, signal relating to: causing correlation of a digital signal provided by a receiver with a motion-compensated correlation code, wherein the motion-compensated correlation code is a correlation code that has been compensated before correlation using one or more phasors dependent upon an assumed or measured movement of the receiver.

8 Claims, 7 Drawing Sheets

(56) References Cited

U.S. PATENT DOCUMENTS

| | | | |
|---|---|---|---|
| 2002/0012308 A1* | 1/2002 | Tonami | G11B 20/10009 369/59.22 |
| 2002/0080070 A1* | 6/2002 | Harles | G01S 13/325 342/458 |
| 2002/0146065 A1* | 10/2002 | Kohli | G01C 21/26 375/150 |
| 2003/0164200 A1* | 9/2003 | Czeranna | B62D 65/18 141/1 |
| 2004/0150557 A1 | 8/2004 | Ford et al. | 342/357.14 |
| 2007/0118286 A1 | 5/2007 | Wang et al. | 701/213 |
| 2010/0117884 A1* | 5/2010 | Ahmed | G01S 19/21 342/14 |
| 2011/0206090 A1 | 8/2011 | Kubrak et al. | 375/142 |
| 2012/0050103 A1 | 3/2012 | Revol | 342/357.68 |

FOREIGN PATENT DOCUMENTS

| | | | |
|---|---|---|---|
| WO | 0049695 A1 | 8/2000 | |
| WO | WO 00/49695 | 8/2000 | H02B 7/185 |
| WO | WO 2006/137904 | 12/2006 | G01S 5/14 |

OTHER PUBLICATIONS

Niedermeier, Herbert et al., "DINGPOS: High Sensitivity GNSS Platform for Deep Indoor Scenarios," 2010 International Conference on Indoor Positioning and Indoor Navigation (IPIN), Sep. 15-17, 2010, Zurich, Switzerland, pp. 1-10.

Pany, Thomas et al., "Coherent Integration Time: The Longer, the Better," Inside GNSS, Nov./Dec. 2009, pp. 52-61.

"Combined Search and Examination Report" for Application No. GB1605044.5, dated May 5, 2015, 7 pages.

Giovanni Naddeo, Authorized officer, International Search Report—Application No. PCT/GB2017/050777, dated May 30, 2017, 12 pages, together with the Written Opinion of the International Searching Authority.

Giovanni Naddeo, Authorized officer, International Search Report—Application No. PCT/GB2017/050778, dated May 30, 2017, 12 pages, together with the Written Opinion of the International Searching Authority.

United Kingdom Intellectual Property Office, Combined Search and Examination Report under Section 17 & 18(3)—Application No. GB1605044.5, dated May 5, 2016, 7 pages.

* cited by examiner

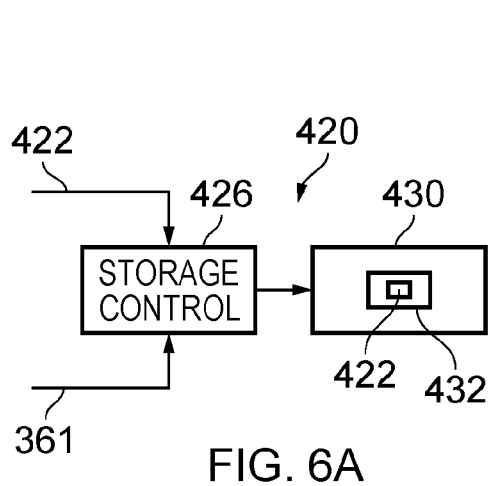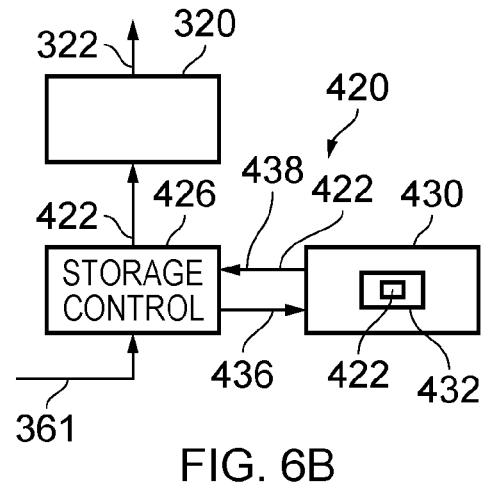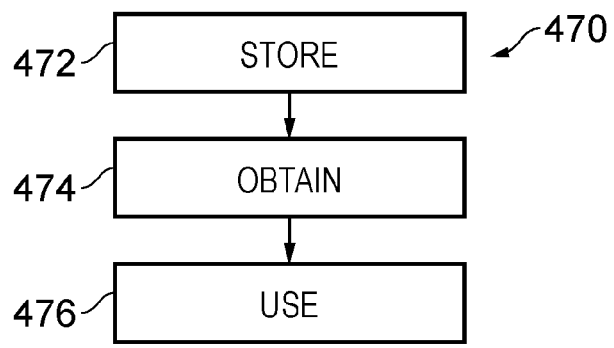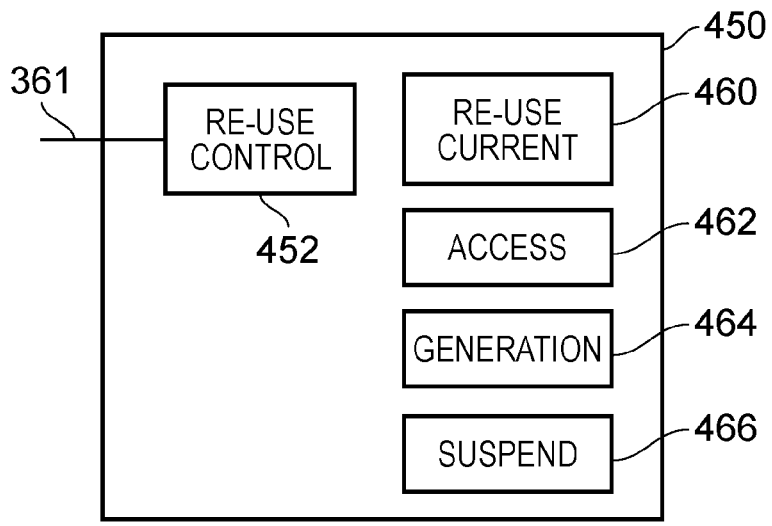

METHOD, APPARATUS, COMPUTER PROGRAM, CHIP SET, OR DATA STRUCTURE FOR CORRELATING A DIGITAL SIGNAL AND A CORRELATION CODE

TECHNOLOGICAL FIELD

Embodiments of the present invention relate to a method, apparatus, computer program, chip set, or data structure for correlating a digital signal and a correlation code.

BACKGROUND

The correlation of a digital signal and a correlation code is dependent upon the quality of the digital signal used. The digital signal is typically received by a receiver via a communications channel. As is well known, a communication channel may introduce noise to a signal received through the communications channel. As the noise increases the signal to noise ratio decreases and it becomes more difficult to perform accurate correlation of the received digital signal and a correlation code.

It would be desirable to provide an improved approach for correlating a received digital signal and a correlation code.

BRIEF SUMMARY

According to various, but not necessarily all, embodiments of the invention there are provided examples as claimed in the appended claims.

BRIEF DESCRIPTION

For a better understanding of various examples that are useful for understanding the brief description, reference will now be made by way of example only to the accompanying drawings in which.

Figure 5:
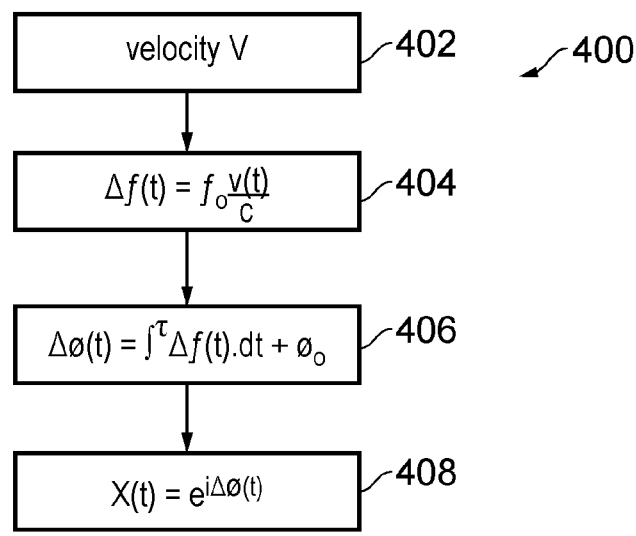
Figure 7B:
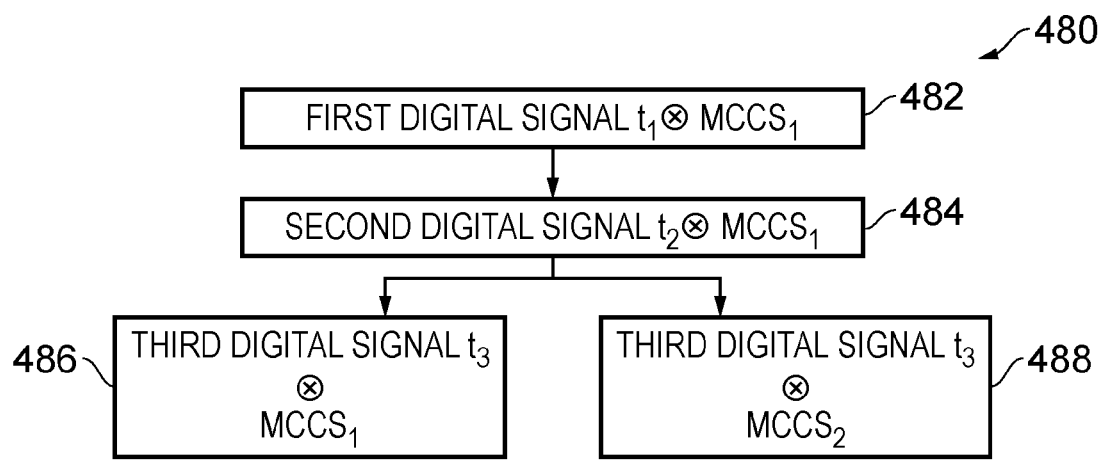
Figure 8:
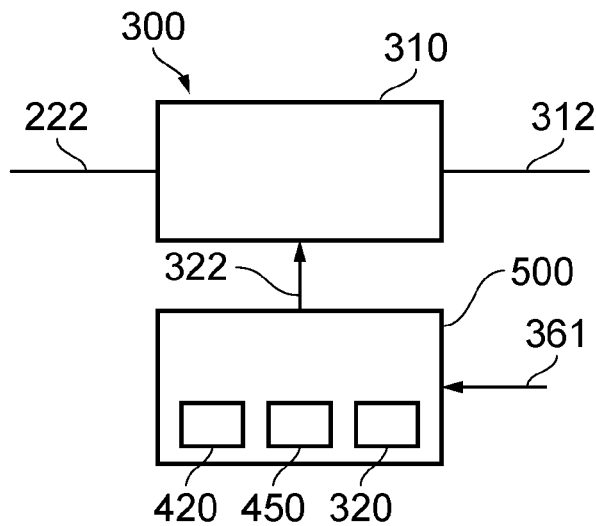
Figure 9:
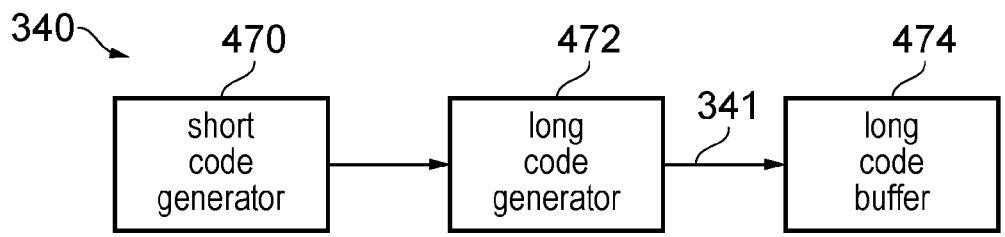
Figure 10:
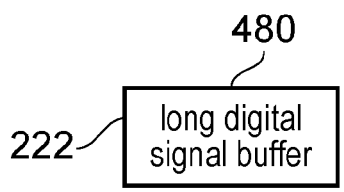
Figure 11:
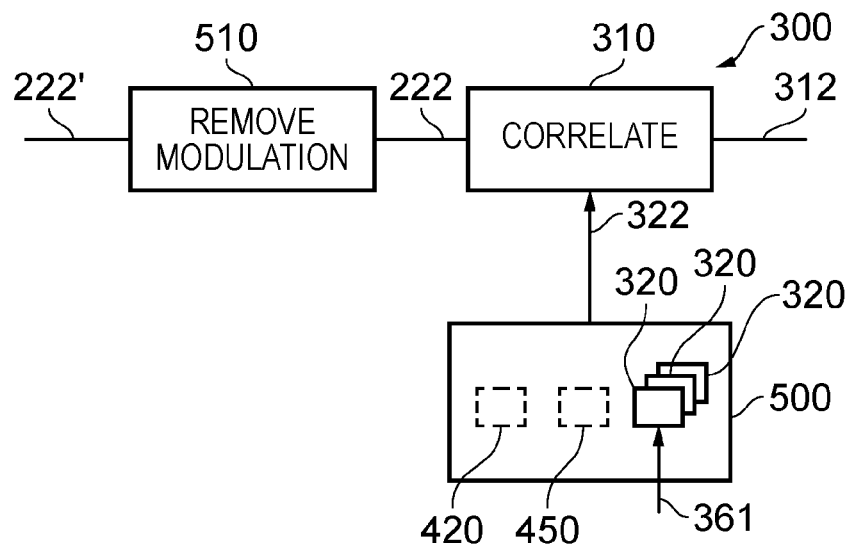
Figure 12:
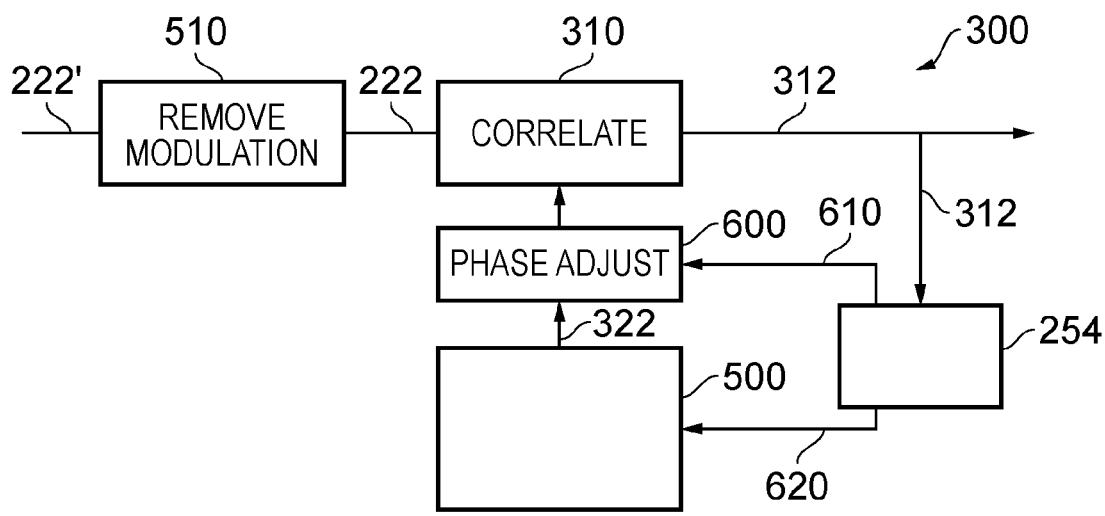
Figure 13:
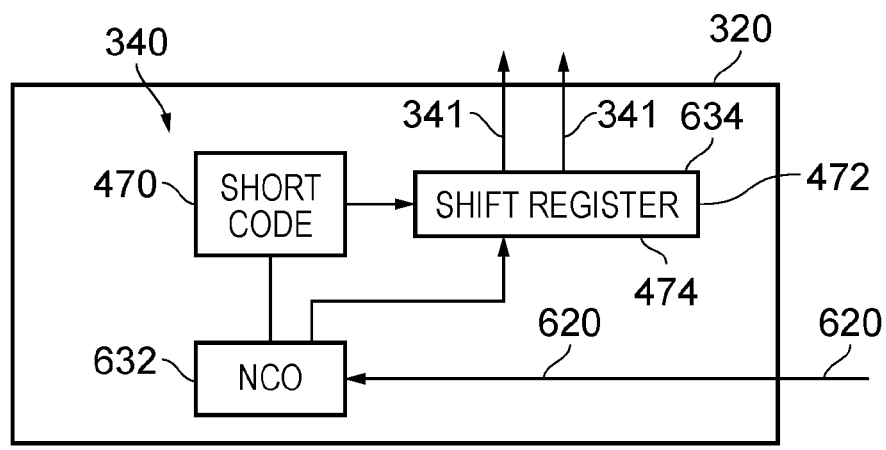
Figure 14A:
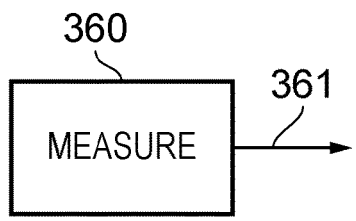
Figure 14B:
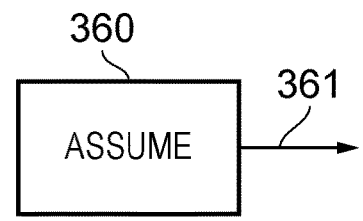
Figure 15:
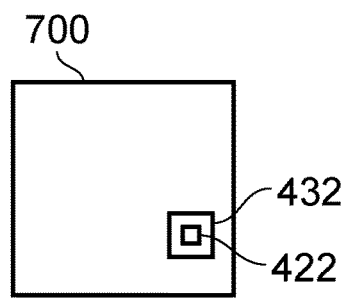
Figure 16B:
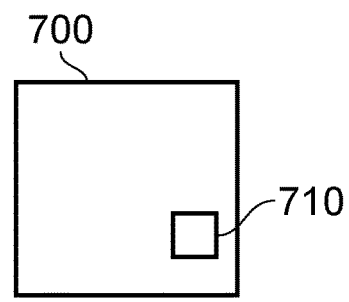
Figure 16A:
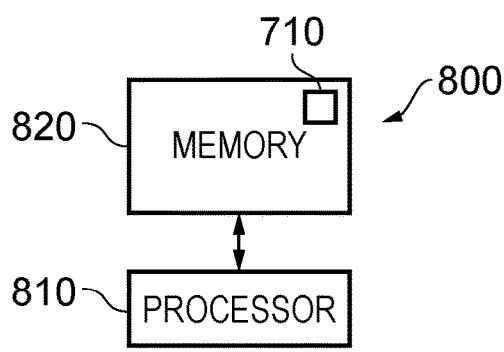
Figure 17:
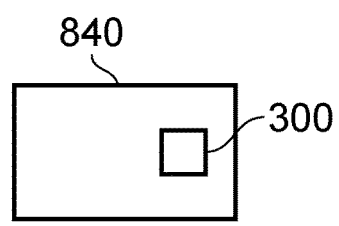
Figure 18A:
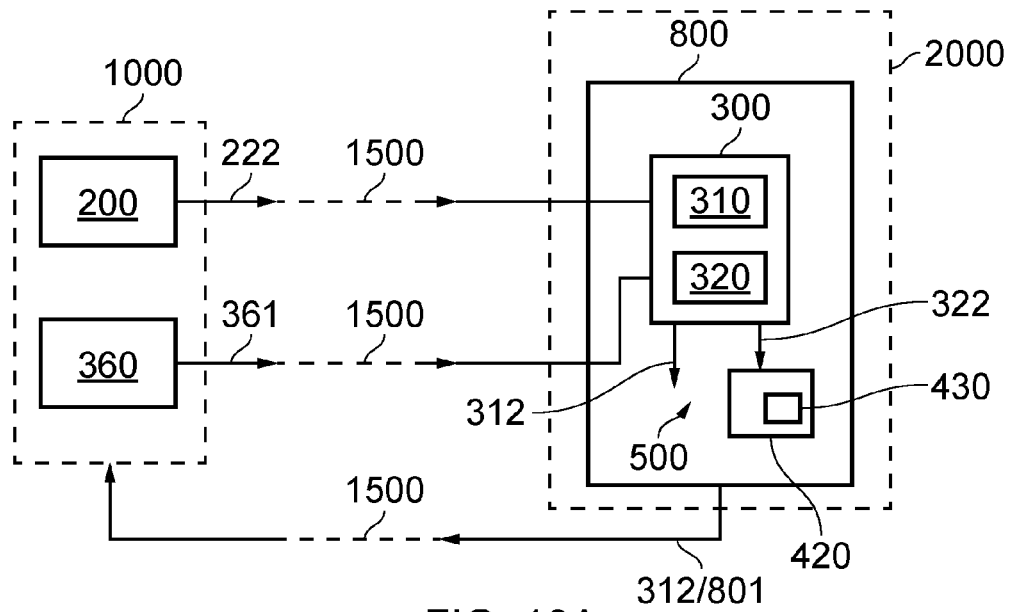
Figure 18B:
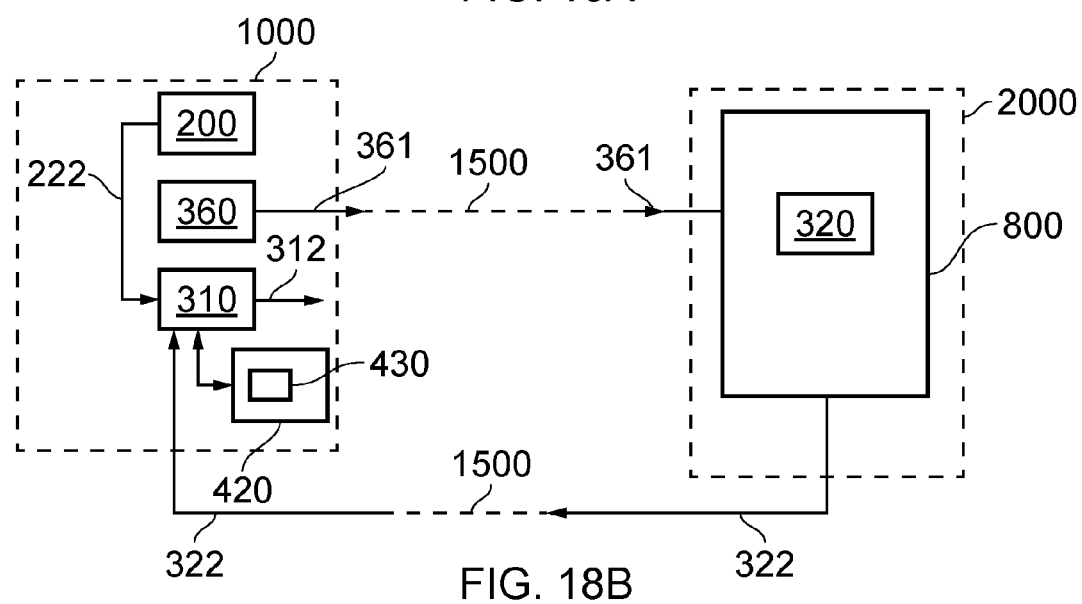
Figure 18C:
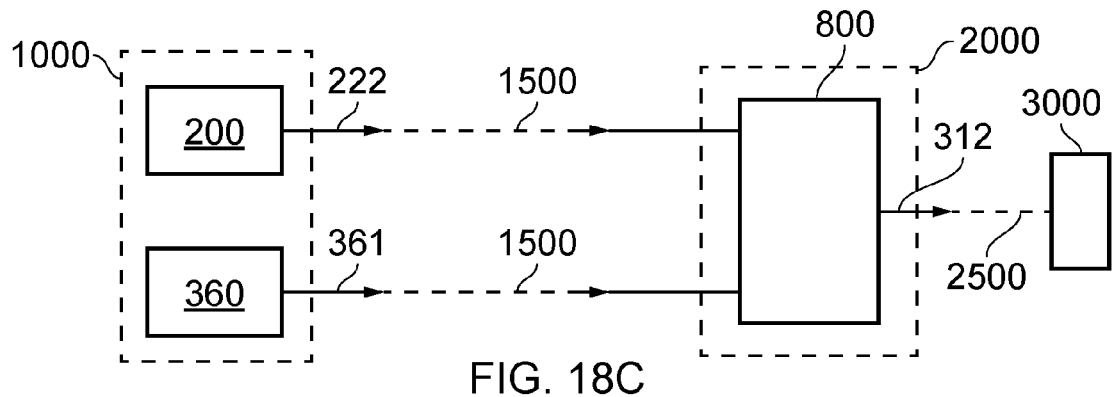

FIG. 5 schematically illustrates an example of a method performed by a motion-compensated phasor generator;

FIGS. 6A and 6B illustrate an example of a motion-compensated correlation sequence storage system during a write operation (FIG. 6A) and during a read operation (FIG. 6B) and FIG. 6C illustrates a method performed by the motion-compensated correlation sequence storage system;

FIG. 7A illustrates an example of a motion-compensated correlation sequence (MCCS) re-use system;

FIG. 7B illustrates an example of a method;

FIG. 8 illustrates an example of a motion-compensated correlator;

FIG. 9 illustrates an example of a long correlation code generator;

FIG. 10 illustrates an example of a long digital signal buffer;

FIG. 11 illustrates an example of a motion-compensated correlator;

FIG. 12 illustrates an example of a motion-compensated correlator;

FIG. 13 illustrates an example of a motion-compensated correlation code generator;

FIGS. 14A and 14B illustrate different examples of a receiver-motion module for producing a movement signal;

FIG. 15 illustrates an example of a record medium;

FIG. 16A illustrates an example of a controller;

FIG. 16B illustrates an example of a computer program;

FIG. 17 illustrates an example of a chip-set;

FIGS. 18A, 18B, 18C illustrates examples of a system, comprising a remote device and a remote processing system, that have different distributions of functions between the remote device and the remote processing system;

DETAILED DESCRIPTION

One form of noise that can arise in a communications channel arises from multi-path effects. A signal received at a receiver may have arrived at the receiver via multiple different paths each of which has different characteristics such as path length. The multi-path signals received are therefore generally received at different times and possibly with different attenuation characteristics and phase. Each multi-path signal may therefore act as noise in relation to each of the other multi-path signals. This can be a significant problem in circumstances where multi-path conditions are prevalent.

Even where multi-path conditions are not prevalent, noise can arise from other sources such as for example clock drift at a receiver, movement of the receiver causing Doppler shifts in frequency, and timing misalignment between a transmitter and the receiver, electromagnetic interference, and intentional jamming.

The signal may also be attenuated by the environment, for example obstructions in the propagation channel, degrading the signal to noise ratio of the received signal.

It would be desirable to improve correlation of a digital signal and a correlation code.

The inventors have realized that by performing a motion-compensated correlation it is possible to significantly improve the correlation of the received digital signal and a correlation code. By, for example, performing motion-compensated correlation along the direction of travel of a receiver, the correlation between received digital signals and the correlation code is significantly biased towards the correlation of a digital signal received along the direction of travel of the receiver and the correlation code. Therefore by compensating for movement of the receiver in a particular direction the gain of signals received from that particular direction is enhanced while the gain of signals received not from that direction (i.e., reflected signals arriving at the receiver from directions that are not toward the transmitter) is decreased. Therefore by performing motion-compensated correlation specifically along the line of sight vector from the receiver to the transmitter the signal to noise ratio of the received signals aligned with the direction of motion-compensation is increased, and the accuracy of the measurement of signal arrival time is improved. It is also possible, by performing the motion-compensated correlation to reduce or remove the effects of Doppler shift, including compensating for any motion of the transmitter.

The inventors have created a new type of motion-compensated correlation sequence (called a supercorrelator) that can be used to perform motion-compensated correlation. The motion-compensated correlation sequence may be stored and may be re-used.

A further advantage of using motion-compensated correlation is that longer correlation periods can be used to improve correlation gain. The use of longer correlation periods significantly improves the correlation gain and so makes the receiver significantly more sensitive.

A further advantage of motion-compensated correlation is the ability to perform long coherent integrations while the receiver is moving.

The following definitions will be used in this document:

A correlation code is a certain sequence of symbols that is known to have specific autocorrelation properties.

A correlation sequence is a sequence of symbols that is correlated with a digital signal during correlation. A symbol represents an integer number of one or more bits. The correlation sequence may be represented in the form of a sequence of real numbers, or a sequence of complex numbers.

Motion-compensated correlation is correlation that uses a motion-compensated correlation sequence.

A motion-compensated correlation sequence is a correlation sequence that has been phase-compensated in dependence upon movement (assumed or measured) of a receiver.

A motion-compensated correlation sequence is used in this document to refer to either a motion-compensated phasor sequence or a motion-compensated correlation code. In practice, the motion compensated correlation sequence is constructed using a motion-compensated phasor sequence.

A motion-compensated phasor sequence is a sequence of phasors that have been phase-compensated in dependence upon movement (assumed or measured) of a receiver.

A motion-compensated correlation code is a correlation code that has been compensated by a sequence of phasors that have been phase-compensated in dependence upon movement (assumed or measured) of a receiver. A motion-compensated correlation code may, for example, be formed by the combination of a correlation code and a motion-compensated phasor sequence.

The phase compensation may optionally also take into account any errors caused by instability of the local oscillator during the time period associated with the correlation sequence. The phase compensation may optionally also take into account the motion of the transmitters, for example in the case of satellite-based transmitters.

Motion compensation can be provided by direct measurements, modelling/predicting/estimating behaviour, or through indirect methods such as an optimisation process over a range of possible velocities.

Coherent integration is the summation of sequences of symbols in such a manner as to preserve the phase relationship of the input sequence throughout, such that sections of the sequence can be added together constructively in both amplitude and phase.

Figure 1:
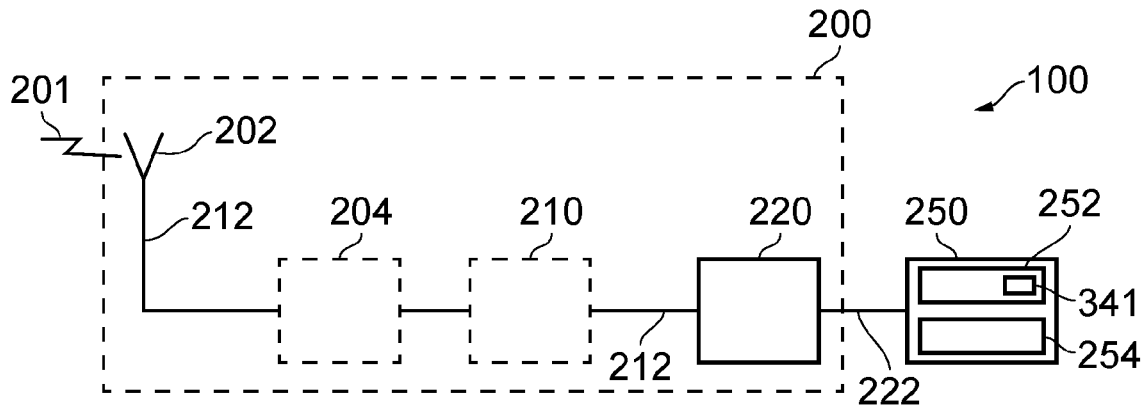
FIG. 1 illustrates an example of a system for correlating a digital signal and a correlation code.

FIG. 1 illustrates an example of a system 100 for correlating a digital signal 222 and a correlation code 341. The system 100 comprises a receiver system (receiver) 200 and processing system 250.

The receiver 200 comprises an antenna or antennas 202 for receiving signals 201 to produce an analogue signal 212. In this example, but not necessarily all examples, the analogue signal 212 is amplified by a pre-amplifier 204, however this stage is optional. Next the analogue signal 212, in this example but not necessarily all examples, is down-converted by down-converter 210 to a lower frequency analogue signal. However, this stage is also optional. The analogue signal 212 is then converted from analogue form to digital form by analogue to digital converter 220 to produce a digital signal 222. This is the received digital signal. The received digital signal 222 is provided to processing system 250.

The processing system 250 comprises a correlation system 252 and also, in this example but not necessarily all examples, comprises a control system 254. The correlation system 252 correlates the received digital signal 222 with a correlation code 341. The control system 254, if present, may be used to control the correlation system 252.

Figure 2:
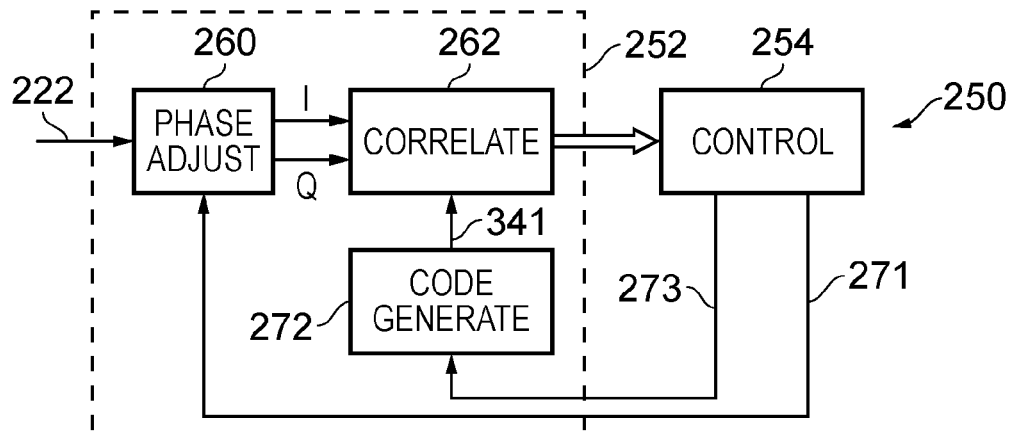
FIG. 2 illustrates an example of the system for correlating a digital signal and a correlation code that does not use motion-compensated correlation based on a motion-compensated correlation sequence.

FIG. 2 illustrates an example of the processing system 250 for correlating a digital signal 222 and a correlation code 341. This example does not use motion-compensated correlation based on a motion-compensated correlation sequence and is intended to demonstrate the difference between motion-compensated correlation using a motion-compensated correlation sequence and correlation that is not motion-compensated because it does not use a motion-compensated correlation sequence.

Initially a phase-adjustment module 260 adjusts the phase of the received digital signal 222. This phase adjustment produces an in-phase digital signal (I) and a quadrature phase digital signal (Q). These complex digital signals are provided to a correlation module 262 which correlates the phase-adjusted digital signals with a correlation code 341. The results of the correlation module 262 are output from the correlation system 252 to the control system 254. The control system 254 uses the results of the correlation to provide a closed loop phase adjustment signal 271 to the phase adjustment module 260 and to provide a closed loop code adjustment signal 273 to a code generation module 272 used to produce the correlation code 341.

Code-phase alignment may be achieved by adjusting the correlation code 341 using the closed loop code adjustment signal 273 which may, for example, form part of a delay locked loop. Carrier-phase alignment may be achieved by adjusting the phase of the received digital signal via the closed loop phase adjustment signal 271 which may be part of a phase locked loop.

While signal to noise levels are sufficiently high and a lock of the closed control loops is maintained, the closed control loops automatically compensate for Doppler shift arising from relative movement between the antenna 202 and a source of the received digital signals 222. However, "lock" may be absent during an acquisition phase, or lost due to temporary signal loss or due to low signal to noise levels, for example.

Figure 3:
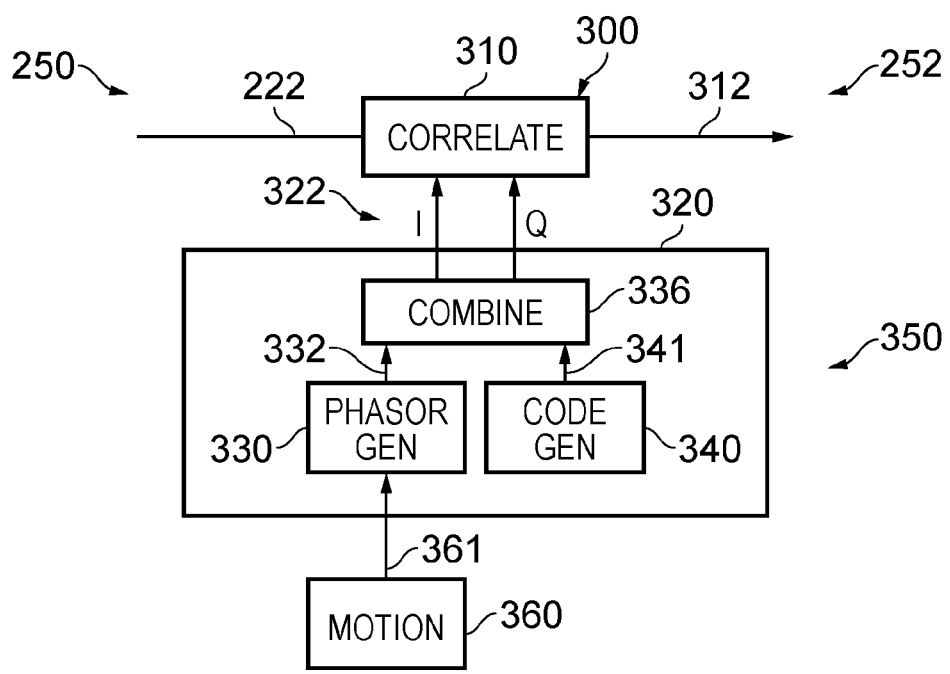
FIG. 3 illustrates an example of a correlation system suitable for use in a processing system of a system for motion-compensated correlation of a digital signal and a correlation code.

The inventors have developed a new processing system 250, illustrated in FIG. 3 that is suitable for use in a system as illustrated in FIG. 1.

The new processing system provides improved correlation of the received digital signal 222 and a correlation code 341 by using motion-compensated correlation based upon a motion-compensated correlation sequence.

It should be appreciated that the processing system 250 of FIG. 3, in contrast to the processing system 250 of FIG. 2, uses open loop control 350 to produce a motion-compensated correlation code 322 used in a correlator 310 to correlate with the received digital signal 222.

The processing system 250 illustrated in FIG. 3 may, for example, be a permanent replacement to the processing system 250 illustrated in FIG. 2 or may be used on a temporary basis as an alternative to the processing system 250 illustrated in FIG. 2.

The open loop control 350 of the processing system 250 in FIG. 3 is based upon an assumed or measured movement 361 of the receiver 200 and is not based upon feedback (closing the loop) from the results of any correlation.

The processing system 250 for motion-compensated correlation of a received digital signal 222 and a correlation code 341 may be used for a number of different applications. It may, for example, be used for time and/or frequency synchronization and/or channel estimation and/or channel separation.

The correlation code 341 used may be application-specific. For example, where the processing system 250 is part of a direct sequence spread spectrum communication system such as a CDMA mobile telecommunications receiver, the correlation code (chipping code) is a pseudo-random noise code. For example, if the receiver 200 is a receiver for a global navigation satellite system (GNSS) the correlation code is a pseudo-random noise code, for example, a Gold code. For example, if the receiver 200 is a receiver for a communication system, the correlation code may be a training or pilot symbol sequence such as those used in orthogonal frequency division multiplexing (OFDM), long term evolution (LTE) and digital video broadcasting (DVB) standards.

In some examples, the correlation code 341 may be dependent upon an identity of a transmitter of the digital signal 222 separating the communication channel into different code divided channels via code division multiple access.

In some circumstances the digital signal 222 is modulated with data, for example navigation bytes in a GNSS system. However, in other examples the digital signal 222 is not modulated with data such as, for example, when it is a training or pilot sequence.

FIG. 3 illustrates an example of a correlation system 252 suitable for use in a processing system 250 of a system 100 for motion-compensated correlation of a digital signal 222 and a correlation code 341. The motion-compensated correlation system 252 provides a motion-compensated correlator 300 comprising a correlator 310 and a motion-compensated correlation sequence generator 320.

A receiver-motion module 360 which may or may not form part of the motion-compensated correlator 300 provides a movement signal 361, indicative of movement of the receiver 200, to the motion-compensated correlation sequence generator 320.

The motion-compensated correlation sequence generator 320 comprises a motion-compensated phasor generator 330 which receives the movement signal 361 and produces a motion-compensated phasor sequence 332.

The motion-compensated correlation sequence generator 320 additionally comprises a correlation code generator 340 which produces a correlation code 341.

The motion-compensated correlation sequence generator 320 additionally comprises a combiner (mixer) 336 which combines the motion-compensated phasor sequence 332 and the correlation code 341 to produce a motion-compensated correlation code 322.

The motion-compensated correlation code 322 is provided by the motion-compensated correlation sequence generator 320 to the correlator 310 which correlates the motion-compensated correlation code 322 with the received digital signal 222 to produce the correlation output 312.

The motion-compensated correlator 300 comprises an open loop 350 from the receiver-motion module 360 through the motion-compensated correlation sequence generator 320 to the correlator 310. There is no feedback resulting from the correlation output 312 to the motion-compensated correlation sequence generator 320 and it is therefore an open loop system.

It will therefore be appreciated that the correlator 310 performs the following method: correlating a digital signal 222 provided by a receiver 200 with a motion-compensated correlation code 322, wherein the motion-compensated correlation code 322 is a correlation code 341 that has been compensated before correlation using one or more phasors dependent upon an assumed or measured movement of the receiver 200. The correlation code 341 is compensated for movement of the receiver 200 before correlation by combining the correlation code 341 with the motion-compensated phasor sequence 332. The motion-compensated phasor sequence 332 is dependent upon an assumed or measured movement of the receiver 200 during the time that the receiver 200 was receiving the digital signal 222.

It will therefore be appreciated that the motion-compensated correlation sequence generator 320 causes correlation of a digital signal 222 provided by a receiver 200 with a motion-compensated correlation code 322, wherein the motion-compensated correlation code 322 is a correlation code 341 that has been compensated before correlation using one or more phasors dependent upon an assumed or measured movement of the receiver.

The use of an open loop 350 for controlling the motion-compensated correlation has advantages, for example, it is fast because the control is not based upon the result of a preceding correlation. The use of the open loop control to perform motion-compensated correlation enables the correlator 310 to operate in situations where there is a low signal to noise ratio.

Although in FIG. 3 receiver-motion module 360, the motion-compensated correlation sequence generator 320 and the correlator 310 are illustrated as part of the motion-compensated correlator 300, in other examples only the correlator 310 may be part of the correlation system with the motion-compensated correlation code 322 being provided to the motion-compensated correlator 300 by a motion-compensated correlation system generator 320 that is not part of motion-compensated correlator 300. In other examples, only the correlator 310 and the motion-compensated correlation sequence generator 320 may be part of the motion-compensated correlator 300 with the receiver-motion module 360 providing the movement signal 361 to the motion-compensated correlator 300.

Although in this example, the motion-compensated correlation sequence generator 320 is illustrated as a single entity comprising the motion-compensated phasor generator 330, the correlation code generator 340 and the combiner (mixer) 336, it should be understood that these may be components distinct from the motion-compensated correlation sequence generator 320 or combined as components other than those illustrated within the motion-compensated correlation sequence generator 320.

It will be appreciated by those skilled in the art that the motion-compensated correlator 300 illustrated in FIG. 3 is a significant and remarkable departure from what has been done before in that it adopts a counter-intuitive approach by modifying the correlation code 341 before correlation even though those correlation codes 341 may have been carefully designed for excellent cross-correlation results.

The motion-compensated correlator 300 illustrated in FIG. 3 may be permanently functional or may be temporarily functional. For example it may be functional during a satellite acquisition phase in a GNSS receiver, and/or when there is signal loss and/or when there are low signal to noise levels for example. The motion-compensated correlator 300 may preserve the phase coherence of the digital signal 222, thus allowing longer coherent integration times.

Figure 4:
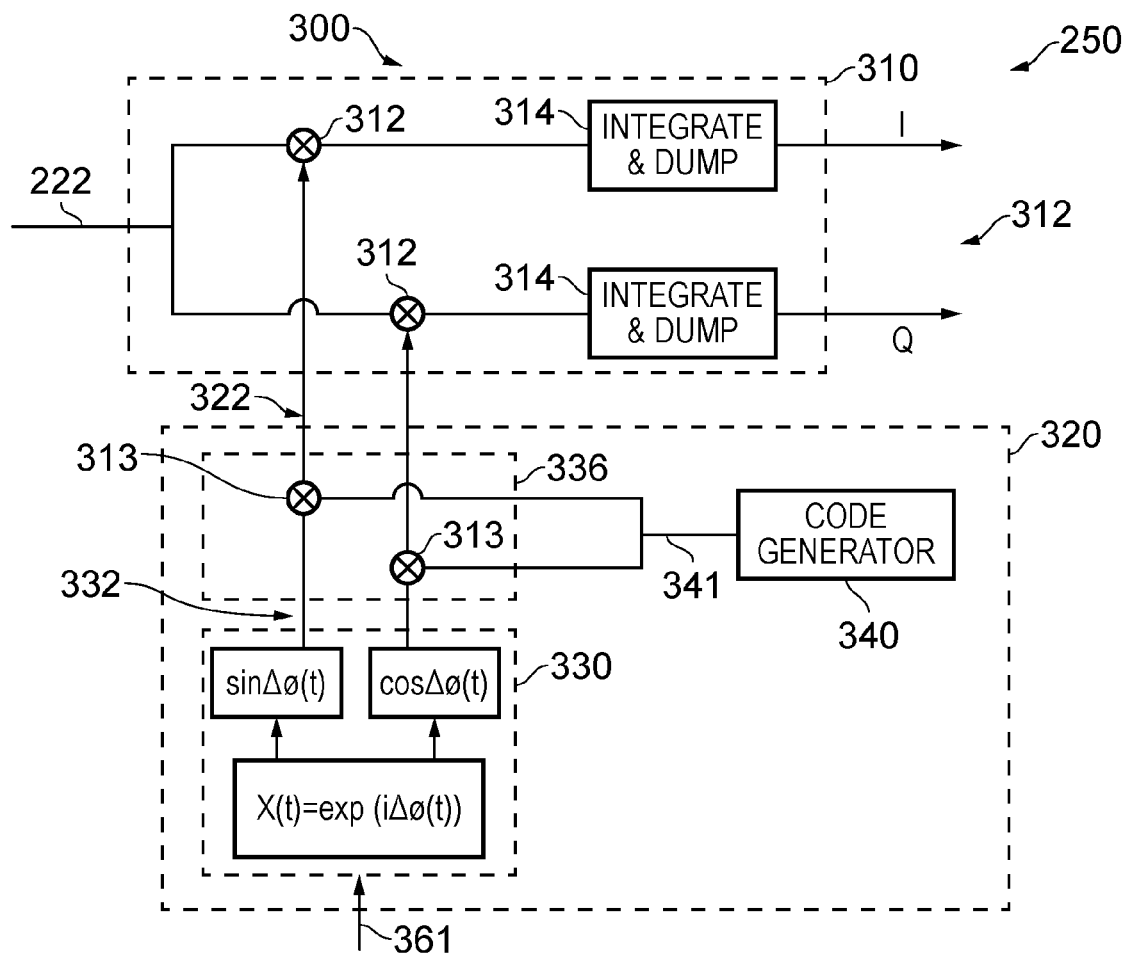
FIG. 4 illustrates an example of a motion-compensated correlator.

FIG. 4 illustrates an example of the motion-compensated correlator 300 illustrated in FIG. 3. This figure illustrates potential sub-components of the correlator 310, and the motion-compensated correlation sequence generator 320.

In this example the motion-compensated phasor generator 330 produces a motion-compensated phasor sequence 332 that comprises an in-phase component I and a quadrature phase component Q. Both of the in-phase component I and the quadrature phase component Q are mixed 313 with the same correlation code 341 produced by the code generator 340 to produce as the motion-compensated correlation code 322 an in-phase component I and a quadrature phase component Q. The correlator 320 mixes 312 the in-phase component of the motion-compensated correlation code 322 with the received digital signal 222 and performs an integration and dump 314 on the result to produce an in-phase correlation result 312. The correlator 310 mixes 312 the quadrature phase motion-compensated correlation code 322 with the same received digital signal 222 and performs an integration and dump 314 on the result to produce the quadrature phase correlation result 312.

It is important to note that the production of in-phase and quadrature phase signals occurs within the motion-compensated correlation code generator 320 when the motion-compensated phasor sequence 332 is produced. The combination (mixing) of the motion-compensated phasor sequence 332 with the correlation code 341 produces the motion-compensated correlation code 322 which is correlated with the received digital signal 222 to produce the correlation output 312.

The integration performed within the correlator 310 produces a positive gain for those received digital signals 222 correlated with the movement signal 361 used to produce the motion-compensated phasor sequence 332. Those received digital signals 222 that are not correlated with the movement signal 361 used to produce the motion-compensated phasor sequence 332 have a poor correlation with the motion-compensated correlation code 322. There is therefore a differential gain applied by the motion-compensated correlator 300 to received digital signals 222 that are received in a direction aligned with the movement of the movement signal 361 used to produce the motion-compensated phase sequences 332 (increased gain) compared to those received digital signals 222 that are received in a direction not aligned with the movement of the movement signal 361. It will therefore be appreciated that the motion-compensated correlator 300 significantly improves correlation performance in multi-path environments.

FIG. 5 schematically illustrates an example of a method 400 performed by the motion-compensated phasor generator 330. At block 402, a velocity is determined. This velocity may be determined by the motion-compensated phasor generator 330 from the movement signal 361 provided by the receiver-motion module 360 or it may be provided by the receiver-motion module 360. The velocity is the velocity of the receiver 200 when receiving the digital signal 222 that is to be correlated. The velocity may be aligned along a particular direction for example a line of sight to a transmitter or a direction in which a strong signal is expected. At block 404 a Doppler frequency shift is calculated using the velocity v to determine a Doppler frequency shift. At block 406, the Doppler frequency shift is integrated over time to determine a phase correction value $\Delta\phi(t)$. A phasor X(t) is determined at block 408 according to the formulation $\exp(i\Delta\phi(t))$.

By performing the method 400 for each time period tn, corresponding to the sampling times of the digital signal 222 provided by the receiver 200, it is possible to generate a sequence of phasors {X(tn)}. Each phasor has the same duration as a sample of the digital signal 222 and there is the same number of phasors X(tn) in a motion-compensated phasor sequence 332 as there are samples of the digital signal 222 and samples of a correlation code 341. The correlation code 341 may be a series of sequential correlation code words, concatenated to match the duration of the digital signal 222 and the motion-compensated phasor sequence 332. Each phasor X(t) represents a phase compensation based upon the motion of the receiver at time t that is applied to a corresponding sample of the correlation code 341. In this way, the correlation code 341 becomes motion-compensated when the correlation code 341 is combined with the motion-compensated phasor sequence 332.

A phasor X(t) is a transformation in phase space and it is complex valued, producing the in-phase component of the motion-compensated phasor sequence 332 via its real value and the quadrature phase component of the motion-compensated phasor sequence 332 via its imaginary value. The phasor X(t) is a cyclic phasor and may be expressed in a number of different ways, for example as a clockwise rotation from the real axis or as an anti-clockwise rotation from the imaginary axis. Although in this example, the phasor X(t) has a constant amplitude within the motion-compensated phasor sequence 332, in other examples, the phasor may represent both a rotation and a change in amplitude instead of just a rotation. However, in other examples, such as the one illustrated, the phasor is for rotation only.

FIGS. 6A and 6B illustrate an example of a motion-compensated correlation sequence storage system 420 during a write operation (FIG. 6A) and during a read operation (FIG. 6B) and FIG. 6C illustrates a method 470 performed by the motion-compensated correlation sequence storage system 420. The motion-compensated correlation sequence storage system 420 comprises a storage control module 426 which is configured to write to and read from an addressable memory 430. The addressable memory 430 may, in some examples, be part of the motion-compensated correlation sequence storage system 420 and in other examples it may be separate from the motion-compensated correlation sequence storage system 420.

In FIG. 6A, the storage control system 426 receives a movement signal 361 and a motion-compensated correlation sequence 422. The storage control system 426 stores the motion-compensated correlation sequence 422 in the addressable memory 430 in a data structure 432 that is indexed by the movement signal 361. That is, an index dependent upon the movement signal 361 may be used to access and retrieve the motion-compensated correlation sequence 422 from the addressable memory 430.

It will be appreciated that FIG. 6A illustrates a write operation where the storage control system 426 writes the motion-compensated correlation sequence 422 to a memory so that it can be accessed at any later time via an index dependent upon the motion information 361 that corresponds to the motion index associated with the stored motion-compensated correlation sequence 422.

FIG. 6B illustrates an example of a read access performed by the storage control system 426. The storage control system 426 in this example receives movement signal 361 and uses this to produce an index 436 that is sent to the addressable memory 430. If the addressable memory 430 stores a data structure 422 that is associated with the received index then it returns that motion-compensated correlation sequence 422 via a reply signal 438 to the storage control system 426. The storage control system 426 provides the returned motion-compensated correlation sequence 422 to the motion-compensated correlation sequence generator 320 which uses the returned motion-compensated correlation sequence to provide a motion-compensated correlation code 322.

It should be appreciated that in some instances the motion-compensated correlation sequence may be a motion-compensated phasor sequence 332.

It should be appreciated that in some examples the motion-compensated correlation sequence may be a motion-compensated correlation code 322.

FIG. 6C illustrates an example of a method 470 in which at a first time, at block 472, the method 470 stores a motion-compensated correlation sequence in an addressable memory 430. Then, at a later time, at block 474, the method 470 causes addressing of the memory to obtain the stored motion-compensated correlation sequence; and then at block 476, the method 470, causes motion-compensated correlation of a correlation code and a digital signal using the obtained motion-compensated correlation sequence 422.

The motion-compensated correlation sequence 422 is a correlation sequence that has been phase-compensated in dependence upon movement (assumed or measured) of the receiver 200. The motion-compensated correlation sequence 422 may be a motion-compensated phasor sequence 332 comprising a sequence of phasors that have been phased-compensated in dependence upon movement (assumed or measured) of the receiver 200. The motion-compensated correlation sequence 422 may be a motion-compensated correlation code 322 being a correlation code 341 that has been compensated by a sequence of phasors that have been phased-compensated in dependence upon movement (assumed or measured) of the receiver 200.

In this example, the motion-compensated correlation sequence 422 is stored within a data structure 432 in the memory 430. In some examples the data structure 432 may be generated by the motion-compensated correlation sequence generator 320 and provided to the motion-compensated correlation sequence storage system 420 for storage in accordance with the example illustrated in FIG. 6A. However, it is possible for the motion-compensated correlation storage system 420 to obtain the data structure 432 via a different mechanism. For example, the data structure 432 may be provided separately or pre-stored within the storage control system 426 or memory 430.

The data structure 432 is an addressable data structure addressable for read access using a motion-dependent index as described in relation to FIG. 6B. Where the data structure 432 comprises a motion-compensated correlation sequence 422 that is a motion-compensated correlation code 322, then the motion-compensated correlation code 322 may be based upon a reference or standard correlation code, for example, produced by a defined process, e.g., a Gold code or Barker code with defined cross-correlation characteristics. The reference or standard correlation code has been combined with a motion-compensated phasor sequence 332 to produce the motion-compensated correlation code 322.

FIG. 7A illustrates an example of a motion-compensated correlation sequence (MCCS) re-use system 450.

The MCCS re-use system 450 receives as an input the movement signal 361 which is used to determine whether a current in use motion-compensated correlation sequence 422 should be re-used for motion-compensated correlation of a received digital signal 222 (re-use current MCCS block 460), and/or whether a previously used/stored motion-compensated correlation sequence 422 should be re-used/used for motion-compensated correlation of a received digital signal 222 (MCCS access block 462) and/or whether a new motion-compensated correlation sequence 422 should be generated for motion-compensated correlation of a received digital signal 222 (MCCS generation block 464) and/or whether motion-compensated correlation of a received digital signal 222 should be suspended (MCCS suspend block 466).

The MCCS re-use system 450 determines if and what motion-correlation should be performed on a received digital signal 222 using the movement signal 361 which indicates movement of the receiver 200 while it was receiving the digital signal 222 that is to be correlated.

While in this example the MCCS re-use system 450 comprises a re-use current MCCS block 460, a MCCS access block 462, a MCCS generation block 464 and a MCCS suspend block 466, in some examples, the MCCS re-use system 450 comprises mores blocks. In some examples, the MCCS re-use system 450 comprises only a sub-set of the blocks 460, 462, 464, 466, which may be any sub-set of one or more blocks 460, 462, 464, 466.

The MCCS re-use system 450 processes the movement signal 361 in MCCS re-use control block 452 to perform one or more tests to determine which of the blocks 460, 462, 464, 466 should be used. For example the MCCS re-use control block 452 may perform a receiver-movement analysis test to determine which of the blocks 460, 462, 464, 466 should be used. For example the re-use control block 452 may perform a receiver-movement comparison test comparing the movement of the receiver 200 represented by the input movement signal 361 with a previous movement of the receiver associated with a motion-compensated correlation sequence 422 to determine which of the blocks 460, 462, 464, 466 should be used.

In some but not necessarily all examples, if the input movement signal 361 is determined to represent an assumed or measured movement of the receiver 200 that is the same as or corresponds to the immediately preceding movement of the receiver 200 then it may be determined by the re-use control block 452 that the trajectory of the receiver 200 is invariant (repeated) and the currently used motion-compensated correlation sequence 422 may be re-used via the re-use current MCCS block 460.

In some but not necessarily all examples, if the input movement signal 361 is determined to represent an assumed or measured movement of the receiver 200 that is the same as or corresponds to an assumed or measured movement of the receiver 200 for which there exists a stored motion-compensated correlation sequence 422 associated with that receiver movement then it is determined by the MCCS re-use control block 452 that there is a receiver trajectory for which there exists a stored motion-compensated correlation sequence 422 and that stored motion-compensated correlation sequence 422 is accessed in the addressable memory 430 and used via the MCCS access block 462. The accessed stored motion-compensated correlation sequence 422 may be a previously used and/or previously generated motion-compensated correlation sequence 422.

The MCCS re-use control block 452 may determine that it is not desirable or possible to use a current/previous/stored motion-compensated correlation sequence 422. For example, the MCCS re-use control block 452 may determine not to use the re-use current MCCS block 460 and not to use the MCCS access block 462.

If the MCCS re-use control block 452 determines that it is still desirable to use motion-compensated correlation then the MCCS re-use control block 452 causes generation of a new motion-compensated correlation sequence 422 via the MCCS generation block 464. The newly generated motion-compensated correlation sequence 422 is then used for motion-compensated correlation and may, in addition, be stored for future access by the motion-compensated correlation sequence storage system 420 as previously described.

If, however, the MCCS re-use control block 452 determines that conditions are not suitable for motion-compensated correlation, then motion-compensated correlation is suspended at the MCCS suspend block 466 and correlation is performed between the received digital signal 222 and the correlation code 341 without the use of a motion-compensated phasor sequence 332 determined from assumed or measured movement of the receiver 200 via open loop control 350.

FIG. 7B illustrates a method 480 comprising at block 482, causing or performing correlation of a first digital signal 222, received by a receiver 200 during a first time, with a first motion-compensated correlation sequence 422 dependent upon a first assumed or measured movement of the receiver 200 during the first time; and at block 484 causing or performing correlation of a second digital signal 222, received by a receiver 200 during a second time, non-overlapping with the first time, with the first motion-compensated correlation sequence.

A second assumed or measured movement of the receiver 200 during the second time may be used to access the first motion-compensated correlation sequence 222 from an addressable memory 430.

In another example, the method 480 may at block 486 additionally comprise: causing or performing correlation of a third digital signal 222, received by the receiver 200 during the third time, non-overlapping with the first time and the second time, with the accessed first motion-compensated correlation sequence (block 460 or block 462 in FIG. 7A). The method 480 may comprise causing or performing use of a third assumed or measured movement of a receiver 200 during the third time to access the first motion-compensated correlation sequence from an addressable memory (block 462 in FIG. 7A).

In another example, the method 480 may at block 488 comprise: causing or performing correlation of a third digital signal 222, received by the receiver 200 during a third time, non-overlapping with the first time and the second time, with a second motion-compensated correlation sequence 422 different to the first motion-compensated correlation sequence 422 and dependent upon an assumed or measured movement of the receiver 200 during the third time (block 462 or block 464 in FIG. 7A). The method 480 may comprise causing or performing generation of the second motion-compensated correlation sequence 422 dependent upon an assumed or measured movement of a receiver during the third time (block 464 in FIG. 7A).

The method 480 may comprise causing or performing a comparison test comparing the first assumed or measured movement and the third assumed or measured movement of the receiver 200. When it is determined that the first movement and the third movement pass a comparison test, the method 480 may cause or perform correlating the third digital signal, received at the receiver during the third time, with the first motion-compensation sequence. When it is determined that the first movement and the third movement do not pass a comparison test, the method 480 may cause or perform correlating the third digital signal, received at the receiver during the third time, with the second motion-compensation sequence.

The method 480 may comprise causing or performing a comparison test comparing the first assumed or measured movement and a fourth assumed or measured movement of the receiver during a fourth time during which a fourth digital signal 222 is received (not shown in FIG. 7B). When it is determined that the first movement and the fourth movement do not pass a comparison test, the method 480 may cause or perform correlating the fourth digital signal with a motion-compensated correlation sequence dependent upon the fourth movement or with the correlation code 341. When it is determined that the first movement and the fourth movement pass a comparison test, the method 480 may cause or perform correlating the fourth digital signal with the first motion-compensated correlation sequence.

Where the first motion-compensated correlation sequence 422 is a first motion-compensated correlation code 322, that is a correlation code 341 compensated by a first motion-compensated phasor signal, the second motion-compensated correlation sequence 422 may be the same correlation code 341 compensated by a second, different motion-compensated phasor signal.

Where the first motion-compensated correlation sequence 422 is a first motion-compensated phasor sequence 332, the second motion-compensated correlation sequence 422 is a second, different motion-compensated phasor sequence. However, the first motion-compensated phasor sequence 332 and the second motion-compensated phasor sequence 332 may be used to compensate the same correlation code 341 to produce different motion-compensated correlation codes 322.

In this way, it may be possible to re-use an existing motion-compensated correlation sequence 422 for an extended period of time. In the case of static signal sources, such as terrestrial radio transmitters, or geostationary satellites, the period of time may be without bound. For moving transmitters, such as GNSS satellites, the reusability will decrease over time, as the Doppler shift of the signal changes relative to the one recorded in the MCCS. In this instance the sequences may be reusable for perhaps for as long as 10 or more seconds. Where the correlation code 341 has a length of 1 ms., that is a duration of longer than 10,000 periods of the correlation code 341.

It will be appreciated that the storage of the motion-compensated correlation sequence 422 for re-use may significantly reduce a computational load required to perform motion-compensated correlation.

As described in relation to FIG. 7A, the motion-compensated correlation sequence re-use system 450 may intelligently decide whether or not to perform motion-compensated correlation and, if it is to perform motion-compensated correlation, whether it is to generate a new motion-compensated correlation sequence 422 or whether it should re-use a motion-compensated correlation sequence 422 and, if it should re-use a motion-compensated correlation sequence 422, whether it should re-use the currently used motion-compensated correlation sequence 422 or whether it should re-use a stored motion-compensated correlation sequence 422. The re-use of a motion-compensated correlation sequence 422 is particularly advantageous where the receiver 200 is often involved in the same motion whether on a continual or intermittent basis. For example, if a pedestrian is walking with a particular direction and with a particular gait this may be detected and used as a movement signal 361 to determine whether or not to re-use a motion-compensated correlation sequence 422. Particular well-defined triggers in the motion data, such as the heel strike of pedestrian walking motion, can be used to mark the beginning of reusable sections of motion-compensated correlation sequences, and to detect the moments in the future when the sections can be reused. Other aspects can be tested for similarity, such as compass heading, orientation, speed, etc. It would therefore be possible to re-use a motion-compensated correlation sequence 422 while a person is walking in the same direction while they maintain the same trajectory, i.e., the same bearing and walking speed. A detection of a change in the bearing, the stride length, the gait or the stride rate may cause an interrupt at the re-use system 450 which may then switch from using the re-use current MCCS block 460, to using one or the other blocks 462, 464, 466.

FIG. 8 illustrates a motion-compensated correlator 300 comprising a motion-compensated correlation sequence (MCCS) system 500 comprising a motion-compensated correlation sequence (MCCS) storage system 420, a motion-compensated correlation sequence (MCCS) re-use system 450 and a motion-compensated correlation sequence (MCCS) generator 320, all as previously described. The system 500 uses the re-use system 450 to determine whether or not to perform motion-compensated correlation and if it is to perform motion-compensated correlation then whether it is to generate a new motion-compensated correlation sequence 422 or to re-use a motion-compensated correlation sequence 422. If it is to re-use a stored motion-compensated correlation sequence then the re-use system 450 provides the movement signal 361 received by the system 500 to the storage system 420 which performs a read access on a addressable memory 430 to obtain the motion-compensated correlation sequence 422. The motion-compensated correlation sequence 422 read from the memory 430 is provided to the motion-compensated correlation sequence generator 320 if it is a motion-compensated phasor sequence to produce a motion-compensated correlation code 322 for the correlator 310 or is provided directly to the correlator 310 if it is a motion-compensated correlation code 322. When a new motion-compensated correlation sequence 422 is required to be generated, the re-use system 450 controls the motion-compensated correlation sequence generator 320 to generate a motion-compensated correlation sequence 422 and to use that sequence for correlation of the digital signal 222. The generated motion-compensated correlation sequence 422 may then be provided to the storage system 420 for storage in the addressable memory 430.

FIG. 9 illustrates an example of a correlation code generator 340 that provides a correlation code 341 that may be used for motion-compensated correlation as described above. The correlation code 341 is a long correlation code as described below. A short code generator 470 produces a correlation code 341'. A long code generator 472 concatenates the correlation code 341' multiple times to produce the long correlation code 341. The long correlation code may be stored in a buffer memory 474 that is of sufficient size to temporarily store a concatenation of multiple correlation codes 341'. FIG. 10 illustrates an example of a long digital signal buffer 480 that temporarily stores a received digital signal 222 that may be used for motion-compensated correlation as described above. This is a buffer memory 474 that is of sufficient size to temporarily store received digital signal 222 that has a duration as long as the long correlation code 341.

The digital signal 222 is a long digital signal, the correlation code 341 is a long correlation code, the motion-compensated correlation code 322 is a long motion-compensated correlation code.

The long digital signal 222, the long correlation code 341 and the long motion-compensated correlation code 322 have the same length. Each having a duration greater than a length of the correlation code word e.g., greater than 1 ms for GPS or greater than 4 ms for GALILEO. For example, the duration may be N*1 ms or M*4 ms where N, M are natural numbers greater than 1. It may in some examples be possible to change the duration, for example, in dependence upon confidence of receiver motion measurement. It may in some examples be possible to increase and/or decrease N or M. It may in some examples be possible to select between having a duration N*1 ms or M*4 ms. A longer duration increases correlation time providing better gain.

The long correlation code 341 is a concatenation of multiple ones of a same first correlation code 341'.

The first correlation code 341' may be a standard or reference code e.g., a Gold code, Barker code or a similar that has a fixed period T and predetermined cross-correlation properties.

A long motion-compensated correlation sequence 422 may be referred to as a supercorrelation sequence. A supercorrelation sequence may be a long motion-compensated phasor sequence or a long motion-compensated correlation code (phasor adjusted).

FIG. 11 illustrates an example of a motion-compensated correlator 300 comprising a motion-compensated correlation sequence (MCCS) system 500 optionally comprising a motion-compensated correlation sequence (MCCS) storage system 420, optionally comprising a motion-compensated correlation sequence (MCCS) re-use system 450 and comprising multiple motion-compensated correlation sequence (MCCS) generators 320.

Each of the multiple motion-compensated correlation code generators 320 generates a long motion-compensated correlation code 322 which is a long correlation code 341 that has been compensated, before correlation, using the same long motion-compensated phasor sequence 332 dependent upon an assumed or measured movement of the receiver 200.

A first one of the multiple motion-compensated correlation code generators 320 produces an early long motion-compensated correlation code 322 which is a long correlation code 341 that has been compensated, before correlation, using the same long motion-compensated phasor sequence 332 dependent upon an assumed or measured present movement of the receiver 200 and time shifted to be early.

A second one of the multiple motion-compensated correlation code generators 320 produces a present (prompt) long motion-compensated correlation code 322 which is a long correlation code 341 that has been compensated, before correlation, using the same long motion-compensated phasor sequence 332 dependent upon an assumed or measured present movement of the receiver 200.

A third one of the multiple motion-compensated correlation code generators 320 produces a late long motion-compensated correlation code 322 which is a long correlation code 341 that has been compensated, before correlation, using the same long motion-compensated phasor sequence 332 dependent upon an assumed or measured present movement of the receiver 200 and time shifted late.

Each of the early long motion-compensated correlation code, present (prompt) long motion-compensated correlation code and late long motion-compensated correlation code are separately correlated with the same long digital signal 222.

The motion-compensated correlator 300 is suitable for use in a global navigation satellite system (GNSS) where the received digital signal 222 is transmitted by a GNSS satellite. The motion-compensated correlator 300 may be part of a GNSS receiver 200.

In some but not necessarily all examples, down-conversion of a received signal before analogue to digital conversion to create the digital signal 222 occurs, in other examples it does not. Where down-conversion of a received signal before analogue to digital conversion to create the digital signal 222 occurs, in some but not necessarily all examples, the down-conversion is independent of a measured movement of the receiver 200 and is not controlled in dependence upon the measured movement of a receiver 200 of the received signal.

In some but not necessarily all examples a modulation removal block 510 may remove any data that has been modulated onto the signals being coherently integrated using the motion-compensated correlator. An example of this is the removal of the navigation bits from a received GNSS digital signal 222' to produce the digital signal 222 processed by the motion-compensated correlator 300.

In this example, the correlation code concatenated to produce the long correlation code 341 is a chipping code (a pseudorandom noise code). It may for example be a Gold code.

Each GNSS satellite may use a different long correlation code 341 in some examples. Multiple motion-compensated correlators 300 may be provided and may be assigned to different satellites. A motion-compensated correlator 300 then performs motion-compensated correlation for the assigned GNSS satellite.

Referring back to FIG. 5, the velocity v may then be the line of sight velocity of the receiver 200 towards the assigned satellite. The motion-compensated correlator 300 then has selective increased gain for the digital signals 222 received from that satellite along the line of sight.

In some example, movement of the assigned satellite may be compensated by using as the velocity v the line of sight relative velocity between the receiver 200 and the assigned satellite. In other examples, movement of the assigned satellite may be compensated by using closed control loop as illustrated in FIG. 12. Correlating the digital signal 222 provided by the receiver 200 with the long motion compensated correlation code 322 additionally uses one or more closed control loops 610, 620 for maintenance of code-phase alignment and/or carrier-phase alignment 620.

A control system 254 uses the results 312 of motion-correlated correlation to provide a closed-loop control signal 610 and/or a closed loop control signal 620.

A closed-loop control signal 610 controls a phase adjust module 600 to adjust the phase of the motion-compensated correlation codes 322 to maintain carrier phase alignment.

A closed-loop control signal 620 controls each of the multiple motion-compensated correlation code generators 320 for the satellite to maintain code phase alignment. FIG. 13 illustrates an example of how motion-compensated correlation code generators 320 may maintain code-phase alignment via a closed loop control signal 620. A numerical controlled oscillator 632 receives the control signal 620 and controls the long correlation code generator 340 using the short code generator 470 and a shift register 634 that buffers the long correlation code 341 and simultaneously operates as long code generator 472 and long code buffer 474 for the multiple motion-compensated correlation code generators 320 used for a particular satellite.

FIGS. 14A and 14B illustrate different examples of a receiver-motion module 360 for producing a movement signal 361 indicative of a movement of the receiver 200 during a particular time duration. The receiver-motion module 360 illustrated in FIG. 14A produces a movement signal 361 indicative of a measured movement of the receiver 200. The receiver-motion module 360 illustrated in FIG. 14B produces a movement signal 361 indicative of an assumed movement of the receiver 200.

The movement signal 361 may be a parameterized signal defined by a set of one or more parameters.

The receiver-motion module 360 may, for example, be used to determine a velocity of a pedestrian or a vehicle.

The receiver-motion module 360 that measures the receiver movement as illustrated in FIG. 14A may have a local navigation or positioning system that tracks motion of the receiver 200, such as a pedestrian dead reckoning system, an inertial measurement system, a visual tracking system, or a radio positioning system.

An inertial measurement system typically calculates velocity by integrating acceleration measurements from inertial sensors such as multi-axis accelerometers and gyroscopes.

A pedestrian dead reckoning system may detect a step from for the example a heel strike, estimation step/stride length, estimate a heading, and determine a 2D position.

A radio positioning system may, for example, use W-Fi positioning and/or Bluetooth positioning.

The receiver-motion module 360 that assumes the receiver movement, illustrated in FIG. 14B, may have a context detection system that detects a context of the receiver 200 such as a specific location at a specific time and determines a receiver velocity on a past history of the receiver velocity for the same context. A learning algorithm may be used to identify re-occurring contexts when the receiver velocity is predictable and to then detect that context to estimate the receiver velocity.

FIG. 15 illustrates an example of a record medium 700 such as a portable memory device storing a data structure 432. The data structure 432 comprises: a motion-compensated correlation sequence 422 that is a combination of a (long) correlation code 341 and a (long) motion-compensated phasor sequence 332 or is a (long) motion-compensated phasor sequence 332. The record medium 700 and the data structure 432 enables transport of the motion-compensated correlation sequence 422. The data structure 432 may be configured as a data structure addressable for read access using a motion-dependent index.

In some but not necessarily all examples, the long motion-compensated correlation sequence 422 is a combination of a long correlation code 341 and a long motion-compensated phasor sequence 332 and the long correlation code 341 is a concatenation of multiple ones of the same standard correlation code.

A controller 800 may be used to perform one or more of the before described methods, the before described blocks and or all or part of a motion-compensated correlator 300.

Implementation of a controller 800 may be as controller circuitry. The controller 800 may be implemented in hardware alone, have certain aspects in software including firmware alone or can be a combination of hardware and software (including firmware).

As illustrated in FIG. 16A the controller 800 may be implemented using instructions that enable hardware functionality, for example, by using executable computer program instructions 710 in a general-purpose or special-purpose processor 810 that may be stored on a computer readable storage medium (disk, memory etc) to be executed by such a processor 810.

The processor 810 is configured to read from and write to the memory 820. The processor 810 may also comprise an output interface via which data and/or commands are output by the processor 810 and an input interface via which data and/or commands are input to the processor 810.

The memory 820 stores a computer program 710 comprising computer program instructions (computer program code) that controls the operation of all or part of a motion-compensated correlator 300 when loaded into the processor 810. The computer program instructions, of the computer program 710, provide the logic and routines that enables the apparatus to perform the methods illustrated in FIGS. 3 to 18 The processor 810 by reading the memory 820 is able to load and execute the computer program 710.

An apparatus comprising the controller may therefore comprise:

at least one processor 810; and at least one memory 820 including computer program code 710 the at least one memory 820 and the computer program code 710 configured to, with the at least one processor 810, cause the apparatus at least to perform:

(i) causing correlation of a digital signal 222 provided by a receiver 200 with a motion-compensated correlation code 322, wherein the motion-compensated correlation code 322 is a correlation code 341 that has been compensated before correlation using one or more phasors 332 dependent upon an assumed or measured movement of the receiver 200; and/or (ii) at a first time, causing or performing storing a motion-compensated correlation sequence 422 in an addressable memory 430;

at a later time, causing or performing addressing the memory 430 to obtain the stored motion-compensated correlation sequence 422; and causing or performing motion-compensated correlation of a correlation code 341 and a digital signal 222 using the obtained motion-compensated correlation sequence 422; and/or (iii) causing or performing correlation of a first digital signal 222, received by a receiver 200 during a first time, with a first motion-compensated correlation sequence 422 dependent upon a first assumed or measured movement of a receiver 200 during the first time; and causing or performing correlation of a second digital signal 222, received by the receiver 200 during a second time, non-overlapping with the first time, with the first motion-compensated correlation sequence 422; and/or (iv) causing or performing correlation of a long digital signal with a long correlation code, wherein the long digital signal and the long correlation code are the same length and the long correlation code is a concatenation of a same first correlation code, wherein the long correlation code has been motion-compensated before correlation, using one or more phasors dependent upon an assumed or measured movement of the receiver.

As illustrated in FIG. 16B, the computer program 710 may arrive at the apparatus 800 via any suitable delivery mechanism 700. The delivery mechanism 700 may be, for example, a non-transitory computer-readable storage medium, a computer program product, a memory device, a record medium such as a compact disc read-only memory (CD-ROM) or digital versatile disc (DVD) or solid state memory, an article of manufacture that tangibly embodies the computer program 710. The delivery mechanism may be a signal configured to reliably transfer the computer program 710. The apparatus 800 may propagate or transmit the computer program 710 as a computer data signal.

Although the memory 820 is illustrated as a single component/circuitry it may be implemented as one or more separate components/circuitry some or all of which may be integrated/removable and/or may provide permanent/semi-permanent/dynamic/cached storage.

Although the processor 810 is illustrated as a single component/circuitry it may be implemented as one or more separate components/circuitry some or all of which may be integrated/removable. The processor 810 may be a single core or multi-core processor.

References to 'computer-readable storage medium', 'computer program product', 'tangibly embodied computer program' etc., or a 'controller', 'computer', 'processor' etc., should be understood to encompass not only computers having different architectures such as single/multi-processor architectures and sequential (Von Neumann)/parallel architectures but also specialized circuits such as field-programmable gate arrays (FPGA), application specific circuits (ASIC), signal processing devices and other processing circuitry. References to computer program, instructions, code etc., should be understood to encompass software for a programmable processor or firmware such as, for example, the programmable content of a hardware device whether instructions for a processor, or configuration settings for a fixed-function device, gate array or programmable logic device etc.

As illustrated in FIG. 17, a chip set 840 may be configured to provide functionality of the controller 800, for example, it may provide all or part of a motion-compensated correlator 300.

The blocks illustrated in the FIGS. 3 to 18 may represent steps in a method and/or sections of code in the computer program 710. The illustration of a particular order to the blocks does not necessarily imply that there is a required or preferred order for the blocks and the order and arrangement of the block may be varied. Furthermore, it may be possible for some blocks to be omitted.

The components of an apparatus or system required to perform one or more of the before described methods, the before described blocks and or all or part of a motion-compensated correlator 300, need not be collocated, and data may be shared between components via one or more communication links.

FIG. 18A illustrates one example of a system comprising a remote device 1000 and a remote processing system 2000. The remote device 1000 comprises the receiver 200 and the receiver motion module 360. The receiver motion module 360 comprises receiver motion sensors that provide receiver motion sensor data as the movement signal 361. The remote device 1000 is physically distant from the remote processing system 2000 comprising the controller 800. The remote device 1000 and the remote device 2000 communicate via communications link(s) 1500. The communications link(s) 1500 may comprise of, for example, wireless communications (e.g., WFi, BLE, Cellular Telephony, Satellite comms), cabled communications (e.g., Ethernet, landline telephone, fibre optic cable), physical storage media that may be transported between components (e.g., solid state memory, CD-ROM) or any combination thereof.

The digital signal 222 is provided by the remote device 1000 to the remote processing system 2000 via the communications link(s) 1500. The receiver motion sensor data is provided as movement signal 361 by the remote device 1000 to the remote processing system 2000 via the communications link(s) 1500.

The controller 800 of the remote processing system 2000 comprises the motion-compensated correlator 300 comprising the correlator 310 and the motion-compensated correlation sequence generator 320.

The motion-compensated correlation sequence generator 320 generates the motion-compensated correlation sequence 322 from processing of the movement signal 361, and the correlator 310 performs motion-compensated correlation of the digital signal 222 using the motion-compensated correlation sequence 322 to produce correlation result 312.

The motion-compensated correlation sequence generator 320, may optionally be part of a motion-compensated correlation sequence (MCCS) system 500 and the motion-compensated correlation sequence 322 may optionally be stored by a motion-compensated correlation sequence storage system 420 in an addressable memory 430 of the remote processing system 2000 for re-use.

In some but not necessarily all examples, the correlation result 312 is returned to the remote device 1000 via the communications link(s) 1500.

In some but not necessarily all examples, the motion-compensated correlation sequence 322 is returned to the remote device 1000 via the communications link(s) 1500.

In some but not necessarily all examples, the controller 800 performs additional post-processing of the correlation results 312 to derive higher-value outputs 801 (e.g., GNSS pseudoranges or position fixes from GNSS signals) that are transferred to the remote device 1000 via communications link(s) 1500.

FIG. 18B illustrates another example of a system comprising a remote device 1000 and a remote processing system 2000. The remote device 1000 comprises the receiver 200 and the receiver motion module 360. The receiver motion module 360 comprises receiver motion sensors that provide receiver motion sensor data as the movement signal 361. The remote device 1000 is physically distant from the remote processing system 2000 comprising the controller 800. The remote device 1000 and the remote device 2000 communicate via communications link(s) 1500. The communications link(s) 1500 may comprise of, for example, wireless communications (e.g., WiFi, BLE, Cellular Telephony, Satellite comms), cabled communications (e.g., Ethernet, landline telephone, fibre optic cable), physical storage media that may be transported between components (e.g., solid state memory, CD-ROM) or any combination thereof.

The receiver motion sensor data is provided as movement signal 361 by the remote device 1000 to the remote processing system 2000 via the communications link(s) 1500.

Part of the motion-compensated correlator 300 (correlator 310) is in the remote device 1000 and part (motion-compensated correlation sequence generator 320) is in the remote processing system 2000.

The motion-compensated correlation sequence generator 320 in the remote processing system 2000 generates a motion-compensated correlation sequence 322 from processing of the received movement signal 361. The motion-compensated correlation sequence 322 is transferred from the remote processing system 2000 to the remote device 100 via the communications link(s) 1500.

The digital signal 222 is not provided by the remote device 1000 to the remote processing system 2000 via the communications link(s) 1500. Instead it is provided to the correlator 310 in the remote device 1000. The correlator 310 performs motion-compensated correlation of the digital signal 222 using the transferred motion-compensated correlation sequence 322 to produce correlation result 312.

At the remote device 1000, the motion-compensated correlation sequence 322 may optionally be stored by a motion-compensated correlation sequence storage system 420 in an addressable memory 430 of the remote processing system 1000 for re-use.

In a variation of the above described examples, the receiver motion module 360 may be configured to processes the receiver motion sensor data to derive a measured or assumed receiver motion value that is provided as movement signal 361. This processed movement signal 361 may be passed to the remote processing system 2000 instead of the raw receiver motion sensor data, removing the need for the remote processing system 2000 to calculate the receiver motion from the receiver motion sensors data.

In a variation of the above described examples, the receiver motion module 360 may not be located at the remote device 1000, but may be located elsewhere, for example, at the remote processing system 2000 or elsewhere.

FIG. 18C illustrates another example of a system comprising a remote device 1000 and a remote processing system 2000. This system is similar to that illustrated in FIG. 18A, however, the correlation results 312 (and/or higher value outputs 801) are not provided to the remote device 1000. The correlation results 312 (and/or higher value outputs 801) are utilised/stored at the remote processing system 2000, or are provided to remote third-party clients 3000 via communications link(s) 2500 for further use/processing/storage.

It should be understood that the above examples may be further modified to include a plurality of remote devices 1000, and/or a plurality of remote processing systems 2000 and/or a plurality of remote third party clients 3000, all connected by a plurality of communications links 1500/2500.

The receiver 200 and the motion-compensated correlator 300 previously described and illustrated may, for example, be used for GNSS systems, radio systems (e.g., OFDM, DVB-T, LTE), sonar systems, laser systems, seismic systems etc.

The term 'causing or performing' as it appears in the claims may mean to cause but not perform, to perform but not cause or to cause and perform.

If an entity causes an action it means removal of the entity would mean that the action does not occur. If an entity performs an action the entity carries out the action.

The interconnection of items in a Figure indicates operational coupling and any number or combination of intervening elements can exist (including no intervening elements).

Where a structural feature has been described, it may be replaced by means for performing one or more of the functions of the structural feature whether that function or those functions are explicitly or implicitly described.

As used here 'hardware module' refers to a physical unit or apparatus that excludes certain parts/components that would be added by an end manufacturer or a user.

A motion-compensated correlator 300 may be a hardware module. A motion-compensated correlation sequence generator 320 may be or may be part of a hardware module. A motion-compensated phasor generator 330 may be or may be part of a hardware module. A correlation code generator 340 may be or may be part of a hardware module. A receiver-motion module 360 may be or may be part of a hardware module. A correlator 310 may be or may be part of a hardware module. A motion-compensated correlation sequence storage system 420 may be or may be part of a hardware module. A (MCCS) re-use system 450 may be or may be part of a hardware module. A motion-compensated correlation sequence (MCCS) system 500 may be or may be part of a hardware module.

The term 'comprise' is used in this document with an inclusive not an exclusive meaning. That is any reference to X comprising Y indicates that X may comprise only one Y or may comprise more than one Y. If it is intended to use 'comprise' with an exclusive meaning then it will be made clear in the context by referring to "comprising only one . . . " or by using "consisting".

In this brief description, reference has been made to various examples. The description of features or functions in relation to an example indicates that those features or functions are present in that example. The use of the term 'example' or 'for example' or 'may' in the text denotes, whether explicitly stated or not, that such features or functions are present in at least the described example, whether described as an example or not, and that they can be, but are not necessarily, present in some of or all other examples. Thus 'example', 'for example' or 'may' refers to a particular instance in a class of examples. A property of the instance can be a property of only that instance or a property of the class or a property of a sub-class of the class that includes some but not all of the instances in the class. It is therefore implicitly disclosed that a features described with reference to one example but not with reference to another example, can where possible be used in that other example but does not necessarily have to be used in that other example.

Although embodiments of the present invention have been described in the preceding paragraphs with reference to various examples, it should be appreciated that modifications to the examples given can be made without departing from the scope of the invention as claimed.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

The invention claimed is:

1. A method comprising:
   causing correlation of a digital signal provided by a receiver with a motion-compensated correlation code, wherein the motion-compensated correlation code is a correlation code that has been compensated before correlation using one or more phasors dependent upon an assumed or measured movement of the receiver;
   storing the motion-compensated correlation sequence for future access in a local or remote addressable memory, indexed based on the first movement; and
   causing or performing generation of the motion-compensated correlation sequence dependent upon an assumed or measured movement of a receiver during a time when the digital signal is received by a receiver before storage of the motion-compensated correlation sequence.

2. A method comprising:
   causing correlation of a digital signal provided by a receiver with a motion-compensated correlation code, wherein the motion-compensated correlation code is a correlation code that has been compensated before correlation using one or more phasors dependent upon an assumed or measured movement of the receiver;
   at a first time, causing or performing storage of a motion-compensated correlation sequence in an addressable memory;
   at a later time, causing or performing addressing of the memory to obtain the stored motion-compensated correlation sequence;
   causing or performing motion-compensated correlation of a correlation code and a digital signal using the obtained motion-compensated correlation sequence; and
   causing or performing generation of the motion-compensated correlation sequence dependent upon an assumed or measured movement of a receiver during a time when the digital signal is received by a receiver before storage of the motion-compensated correlation sequence.

3. A method comprising:
   causing correlation of a digital signal provided by a receiver with a motion-compensated correlation code, wherein the motion-compensated correlation code is a correlation code that has been compensated before correlation using one or more phasors dependent upon an assumed or measured movement of the receiver;
   causing or performing correlation of a first digital signal, received by a receiver during a first time, with a first motion-compensated correlation sequence dependent upon a first assumed or measured movement of a receiver during a first time;
   causing or performing correlation of a second digital signal, received by the receiver during a second time, non-overlapping with the first time, with the first motion-compensated correlation sequence; and
   causing or performing use of a second assumed or measured movement of a receiver during the second time to cause correlation of the second digital signal, received by the receiver during the second time, with the first motion-compensated correlation sequence.

4. A method comprising:
   causing correlation of a digital signal provided by a receiver with a motion-compensated correlation code, wherein the motion-compensated correlation code is a correlation code that has been compensated before correlation using one or more phasors dependent upon an assumed or measured movement of the receiver;
   causing or performing correlation of a first digital signal, received by a receiver during a first time, with a first motion-compensated correlation sequence dependent upon a first assumed or measured movement of a receiver during a first time; and
   causing or performing correlation of a second digital signal, received by the receiver during a second time, non-overlapping with the first time, with a second motion-compensated correlation sequence different to the first motion-compensated correlation sequence and dependent upon an assumed or measured movement of the receiver during the second time.

5. A method comprising:

causing correlation of a digital signal provided by a receiver with a motion-compensated correlation code, wherein the motion-compensated correlation code is a correlation code that has been compensated before correlation using one or more phasors dependent upon an assumed or measured movement of the receiver;

causing or performing correlation of a first digital signal, received by a receiver during a first time, with a first motion-compensated correlation sequence dependent upon a first assumed or measured movement of a receiver during a first time;

causing or performing correlation of a second digital signal, received by the receiver during a second time, non-overlapping with the first time, with the first motion-compensated correlation sequence; and causing or performing a comparison test comparing the first movement and the second movement, wherein when it is determined that the first movement and the second movement pass a comparison test correlating the second digital signal with the first motion-compensation sequence.

6. A method comprising:

causing correlation of a digital signal provided by a receiver with a motion-compensated correlation code, wherein the motion-compensated correlation code is a correlation code that has been compensated before correlation using one or more phasors dependent upon an assumed or measured movement of the receiver, wherein the digital signal is a long digital signal, the correlation code is a long correlation code, the motion-compensated correlation code is a long motion-compensated correlation code and wherein the long digital signal, the long correlation code and the long motion-compensated correlation code have the same length and the long correlation code is a concatenation of multiple ones of a same first correlation code.

7. An apparatus comprising:
   at least one processor; and
   at least one memory including computer program code, the at least one memory and the computer program code configured to, with the at least one processor, cause the apparatus at least to perform the method according to any one of claims 1, 2, 3, 4 and 6.

8. An apparatus as claimed in claim 7, configured as a chip set, application-specific integrated circuit or receiver.

\* \* \* \* \*